US011043644B2

(12) United States Patent
Wang et al.

(10) Patent No.: US 11,043,644 B2
(45) Date of Patent: Jun. 22, 2021

(54) TRANSISTOR ACOUSTIC SENSOR ELEMENT AND METHOD FOR MANUFACTURING THE SAME, ACOUSTIC SENSOR AND PORTABLE DEVICE

(71) Applicants: BOE Technology Group Co., Ltd., Beijing (CN); Hefei Xinsheng Optoelectronics Technology Co., Ltd., Anhui (CN)

(72) Inventors: Qinghe Wang, Beijing (CN); Jinliang Hu, Beijing (CN); Rui Peng, Beijing (CN); Dongfang Wang, Beijing (CN); Guangcai Yuan, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 397 days.

(21) Appl. No.: 15/949,112

(22) Filed: Apr. 10, 2018

(65) Prior Publication Data
US 2019/0067608 A1 Feb. 28, 2019

(30) Foreign Application Priority Data
Aug. 23, 2017 (CN) .................. 201710729633.X

(51) Int. Cl.
H04R 3/00 (2006.01)
H04R 17/02 (2006.01)
(Continued)

(52) U.S. Cl.
CPC ......... H01L 51/0558 (2013.01); G01H 11/06 (2013.01); H01L 51/0003 (2013.01);
(Continued)

(58) Field of Classification Search
CPC ..................... H04R 19/005; H04R 19/016
(Continued)

(56) References Cited

U.S. PATENT DOCUMENTS 4,200,968 A    5/1980  Schroeder
7,058,184 B1*  6/2006  Hickling ............. G01H 3/00
                                              381/92
(Continued)

FOREIGN PATENT DOCUMENTS

CN    1953231 A    4/2007
CN  101404321 A    4/2009
(Continued)

OTHER PUBLICATIONS

Office Action dated Apr. 8, 2019 issued in corresponding Chinese Application No. 201710729633.X.

Primary Examiner — George C Monikang
(74) Attorney, Agent, or Firm — Nath, Goldberg & Meyer; Joshua B. Goldberg

(57) ABSTRACT

The present disclosure provides a transistor acoustic sensor element and a method for manufacturing the same, an acoustic sensor and a portable device. The transistor acoustic sensor element comprises a gate, a gate insulating layer, a first electrode, an active layer and a second electrode arranged on a base substrate, wherein the active layer has a nanowire three-dimensional mesh structure and thus can vibrate under the action of sound signals, so that the output current of the transistor acoustic sensor element changes correspondingly. Since the active layer having the nanowire three-dimensional mesh structure can sensitively sense weak vibration of acoustic waves, the sensitivity to sound signals of the transistor acoustic sensor element is improved.

19 Claims, 2 Drawing Sheets

(51) Int. Cl.
*H01L 51/05* (2006.01)
*H01L 51/00* (2006.01)
*H04R 31/00* (2006.01)
*H04R 7/06* (2006.01)
*H04R 1/40* (2006.01)
*H04R 19/00* (2006.01)
*H04R 19/04* (2006.01)
*G01H 11/06* (2006.01)
*H01L 51/10* (2006.01)
*H04R 23/00* (2006.01)
*H01L 27/28* (2006.01)

(52) U.S. Cl.
CPC ........ *H01L 51/003* (2013.01); *H01L 51/0021* (2013.01); *H01L 51/0023* (2013.01); *H01L 51/0043* (2013.01); *H01L 51/0045* (2013.01); *H01L 51/0097* (2013.01); *H01L 51/057* (2013.01); *H01L 51/102* (2013.01); *H01L 51/105* (2013.01); *H04R 1/406* (2013.01); *H04R 3/005* (2013.01); *H04R 7/06* (2013.01); *H04R 19/005* (2013.01); *H04R 19/04* (2013.01); *H04R 23/006* (2013.01); *H04R 31/00* (2013.01); *H04R 31/003* (2013.01); *H01L 27/283* (2013.01); *H01L 51/004* (2013.01); *H01L 51/0036* (2013.01); *H01L 51/0094* (2013.01); *H01L 2251/303* (2013.01); *H04R 2201/003* (2013.01); *H04R 2201/401* (2013.01); *H04R 2307/027* (2013.01); *H04R 2410/00* (2013.01); *H04R 2499/11* (2013.01)

(58) Field of Classification Search
USPC ................................. 381/122, 92, 111–115
See application file for complete search history.

(56) References Cited

U.S. PATENT DOCUMENTS

| | | | |
|---|---|---|---|
| 9,216,559 | B2 | 12/2015 | Ren et al. |
| 2009/0267057 | A1 | 10/2009 | Setayesh et al. |
| 2010/0060600 | A1* | 3/2010 | Wang ................... G02F 1/13338 345/173 |
| 2010/0072474 | A1* | 3/2010 | Abe ................... H01L 27/11206 257/57 |
| 2010/0323458 | A1 | 12/2010 | Fritsch et al. |
| 2014/0312350 | A1* | 10/2014 | Schneider ........... H01L 27/1214 257/66 |
| 2018/0114931 | A1 | 4/2018 | Tian |

FOREIGN PATENT DOCUMENTS

| | | | |
|---|---|---|---|
| CN | 101442105 | A | 5/2009 |
| CN | 101447552 | A | 6/2009 |
| CN | 101454659 | A | 6/2009 |
| CN | 102263201 | A | 11/2011 |
| CN | 102320752 | A | 1/2012 |
| CN | 102637825 | A | 8/2012 |
| CN | 102719877 | A | 10/2012 |
| CN | 202564377 | U | 11/2012 |
| CN | 103472116 | A | 12/2013 |
| CN | 103490010 | A | 1/2014 |
| CN | 105336857 | A | 2/2016 |
| CN | 105552132 | A | 5/2016 |
| CN | 105977382 | A | 9/2016 |
| CN | 106328729 | A | 1/2017 |
| EP | 0345380 | A2 | 12/1989 |

* cited by examiner

TRANSISTOR ACOUSTIC SENSOR ELEMENT AND METHOD FOR MANUFACTURING THE SAME, ACOUSTIC SENSOR AND PORTABLE DEVICE

TECHNICAL FIELD

The present disclosure relates to the technical field of sensors, and particularly relates to a transistor acoustic sensor element and a method for manufacturing the same, an acoustic sensor and a portable device.

BACKGROUND

Recently, sensors are brought into focus with rapid development of artificial intelligence, wearable electronics and internet of things. The demands for performances of the sensors have also been developed from conventional signal detection to high sensitivity, multiple types, flexibility, small size and the like.

Acoustic sensors, which can sense changes of sound signals, have been widely applied in the fields of intelligent bionic robots, wearable electronics, etc. However, the structure, process and performance of the conventional acoustic sensors hardly meet requirements for sensitivity, flexibility and small size in the field of artificial intelligence or wearable electronics.

Therefore, it has become an important direction of acoustic sensor development nowadays to develop novel acoustic sensors that meet the performance requirements of the artificial intelligence or wearable electronic field.

SUMMARY

In view of the above technical problems in the prior art, the present disclosure provides a transistor acoustic sensor element and a method for manufacturing the same, an acoustic sensor and a portable device. By adopting an active layer having a nanowire three-dimensional mesh structure, the transistor acoustic sensor element can detect sound signals sensitively. Since the active layer of the structure can detect weak vibration of acoustic waves so as to improve the sensitivity to sound signals of the transistor acoustic sensor element, thereby improving the sensing performance on sound.

The present disclosure provides a transistor acoustic sensor element, including a gate, a gate insulating layer, a first electrode, an active layer and a second electrode which are arranged on a base substrate, wherein the active layer have a nanowire three-dimensional mesh structure and the active layer can vibrate under an action of sound signals so that the output current of the transistor acoustic sensor element changes correspondingly.

Optionally, the active layer is arranged between the first electrode and the second electrode, and the active layer is made of a polymer organic semiconductor material.

Optionally, materials used as the active layer may be selected from P3HT, PDQT, PDVT-10, PPhTQ, P(DPP4T-co-BDT), P3OT, BAS-PPE, TA-PPE, PQT-12 or PBIBDF-BT.

Optionally, the active layer substantially has a thickness of about 50 to 500 nm.

Optionally, the active layer includes a single sub-film or a plurality of sub-films.

Optionally, the gate insulating layer is made of alumina.

Optionally, the gate, the first electrode and the second electrode are all made of graphene.

Optionally, the base substrate is made of polydimethylsiloxane.

The present disclosure further provides an acoustic sensor, including a plurality of aforementioned transistor acoustic sensor elements which are arranged in an array.

Preferably, the acoustic sensor further includes a signal acquisition and analysis unit which is connected to each transistor acoustic sensor element and used for acquiring and analyzing output signals of each transistor acoustic sensor elements to obtain information of the sound signals including its incoming direction distribution and intensity distribution.

The present disclosure further provides a portable device, including the aforementioned acoustic sensor.

The present disclosure further provides a method for manufacturing the aforementioned transistor acoustic sensor element, including:

forming a gate, a gate insulating layer, a first electrode, an active layer and a second electrode on a base substrate successively, wherein the active layer is formed on a substrate by adopting a solution spin-coating method and then transferred from the substrate onto the base substrate by adopting a film transfer method, and the active layer has a nanowire three-dimensional mesh structure.

Optionally, the methods for forming the gate, the first electrode and the second electrode are the same, and include:
  forming a graphene film on a copper foil; and
  transferring the graphene film onto the base substrate.

Optionally, transferring the graphene film onto the base substrate includes:
  forming a polymer support layer on the side of the graphene film opposite to the copper foil and solidifying the polymer support layer;
  removing the copper foil to make the polymer support layer support the graphene film;
  transferring the graphene film supported by the polymer support layer onto the base substrate.

When the gate and the first electrode are formed, the method further includes,
  after transferring the graphene film onto the base substrate, removing the polymer support layer in order to form the gate and the first electrode on the substrate.

When the second electrode is formed, the polymer support layer does not need to be removed after transferring the graphene film onto the base substrate.

DETAILED DESCRIPTION OF THE EMBODIMENTS

In order that those skilled in the art better understand the technical solution of the present disclosure, a transistor acoustic sensor element and a manufacturing method thereof, an acoustic sensor and a portable device provided by the present disclosure will be further described in detail with reference to the accompanying drawings and specific embodiments.

Figure 1:
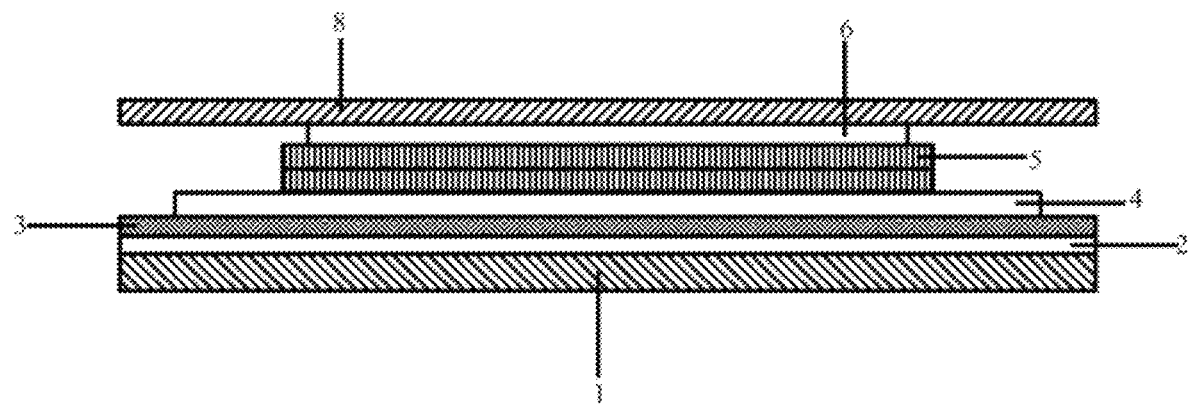
FIG. 1 is a structural section view of a transistor acoustic sensor element in example 1 of the present disclosure.
Figure 2:
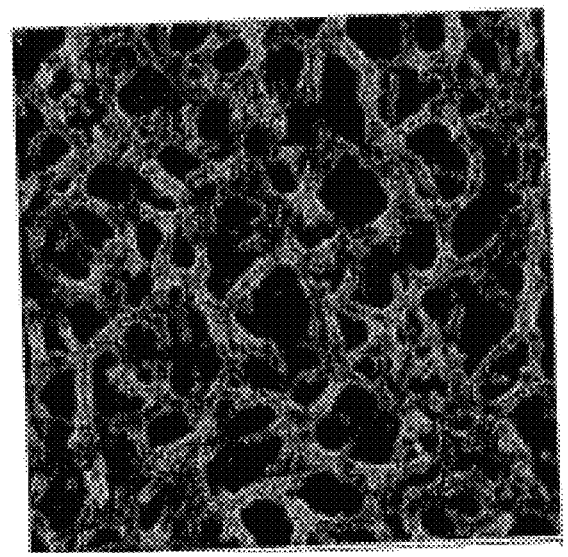
FIG. 2 is a microcosmic structure photo of the active layer in FIG. 1.

As shown in FIGS. 1 and 2, an embodiment of the present disclosure provides a transistor acoustic sensor element including a gate 2, a gate insulating layer 3, a first electrode 4, an active layer 5 and a second electrode 6 which are arranged on a base substrate 1, wherein the active layer 5 has a nanowire three-dimensional mesh structure and can vibrate under the action of sound signals so as to make the output current of the transistor acoustic sensor element change correspondingly.

Figure 3:
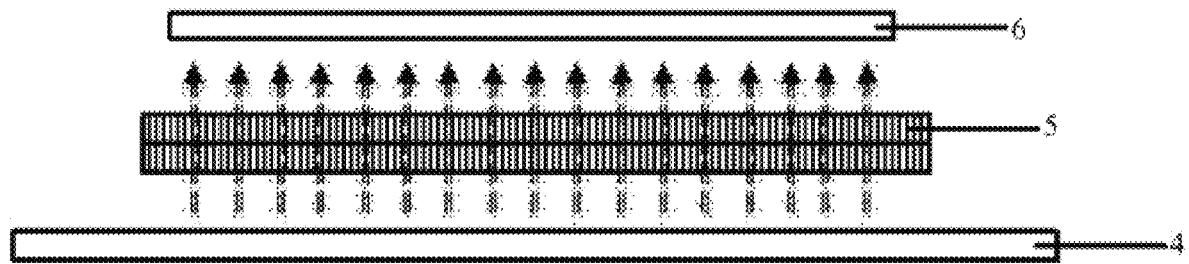
FIG. 3 is a schematic diagram of current transmission among the first electrode, the active layer and the second electrode in a vertical structure transistor of FIG. 1.

The active layer 5 is arranged between the first electrode 4 and the second electrode 6, and the transistor acoustic sensor element is a vertical structure transistor. The first electrode 4 and the second electrode 6 are a source electrode and a drain electrode of the transistor respectively. The vertical structure transistor is a charge injection controlled device, that is, when a negative bias is applied to the source electrode and the gate 2, holes can accumulate at the interface between the source electrode and the active layer 5, thereby effectively reducing the charge injection barrier from the source electrode to the active layer 5. By modulating the voltage of the gate 2, the charge injection efficiency can be controlled so as to adjust the current between the source electrode and the drain electrode. In the vertical structure transistor, like the conventional transistor, the current between the source electrode and the drain electrode is modulated by the voltage of the gate 2 and then a switching device is formed. Different from the conventional transistor, the current between the source electrode and the drain electrode of the vertical structure transistor is transmitted to the entire surface of the drain electrode through the entire surface of the source electrode and the entire surface of the active layer 5 (as shown in FIG. 3).

In this embodiment, the vertical structure transistor senses sound signals based on the following principle: a threshold voltage is applied between the gate 2 and the source electrode of the transistor acoustic sensor element, so that the transistor acoustic sensor element is turned on, and a certain magnitude of current flows from the source electrode to the drain electrode by pass through the active layer 5. When sound signals are transmitted to the acoustic sensor element, vibrations of the acoustic wave will cause the nanowire three-dimensional mesh structure of the active layer 5 vibrate which will further change the magnitude of the current flowing between the source electrode and the drain electrode. And then, the detection of transmitted sound signals can be achieved by detecting the magnitude change of the current between the source electrode and the drain electrode.

The active layer 5 having a nanowire three-dimensional mesh structure can vibrate under the action of sound signals, so that the current from the first electrode 4 to the second electrode 6 by pass through the active layer 5 changes correspondingly on the basis of the original current, and then the detection of the sound signals could be achieved by the changes of the current. Compared with the conventional acoustic sensor devices, since the structure of the active layer 5 can sensitively sense weak vibration of acoustic waves, transistor acoustic sensor element having such an active layer 5 has an improved sensitivity and thereby improved sensing performances on sound.

Optionally, the active layer 5 is arranged between the first electrode 4 and the second electrode 6, and the active layer 5 is made of a polymer organic semiconductor material. Any polymer organic semiconductor material can be used for forming the active layer 5 having a nanowire three-dimensional mesh structure. For example, materials used for the active layer 5 include P3HT (polymer of 3-hexylthiophene), PDQT, PDVT-10, PPhTQ, P (DPP4T-co-BDT) (D-A polymer), P3OT (poly(3-octylthiophene)), BAS-PPE, TA-PPE, PQT-12 or PBIBDF-BT (D-A conjugated polymer) or other polymer organic semiconductor material. The polymer organic semiconductor material has a certain flexibility, which is advantageous for manufacturing a flexible transistor acoustic sensor element, and further applying this element to a field of wearable electronics.

Optionally, the active layer 5 substantially has a thickness of 50 to 500 nm. The active layer 5 in such a thickness range not only can sense sound signals better, but also facilitates thinning and lightening of the transistor acoustic sensor element, so that it can be better applied to the field of wearable electronics or artificial intelligence.

In some embodiments, the active layer 5 includes a single sub-film or a plurality of sub-films. That is, the active layer may be composed of a single sub-film or a plurality of sub-films, which is mainly depended on the manufacturing process of the active layer 5. If only one thin film having a lower thickness then the required thickness of the active layer 5 can be formed in a manufacturing process, a plurality of sub-films stacked need to be formed by carrying out the manufacturing process multiple times in order to obtain the required thickness of the active layer 5. Of course, if the required thickness of the active layer 5 can be realized by carrying a manufacturing process once, the active layer 5 can be composed of one film.

In some embodiments, the gate insulating layer 3 is made of alumina. The gate insulating layer 3 made of alumina has a high dielectric constant, and can realize low-voltage operation of the transistor acoustic sensor element, so that the power consumption of the acoustic sensor element is reduced which is more applicable to the artificial intelligence field having high requirement on power consumption.

Preferably, the gate 2, the first electrode 4 and the second electrode 6 are all made of graphene. The graphene electrodes have good current transmission performance, thereby improving the conductivity and the sound sensing sensitivity of the acoustic sensor element. Meanwhile, the graphene electrodes have a certain flexibility which is beneficial to realizing a flexible transistor acoustic sensor element. In addition, graphene can be manufactured into ultra-thin electrodes (such as electrodes having a thickness of nanometer level), which is beneficial to thinning and lightening the transistor acoustic sensor element.

In some embodiments, the base substrate 1 is made of polydimethylsiloxane. The base substrate 1 of polydimethylsiloxane has a certain flexibility, so that a flexible transistor acoustic sensor element can be realized.

Figure 4:
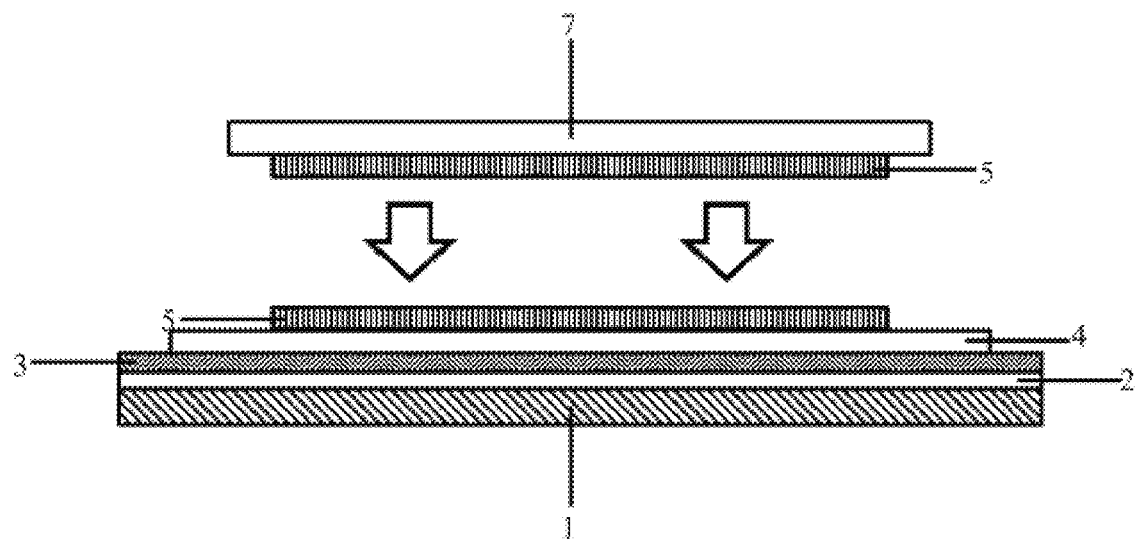
FIG. 4 is a schematic diagram of transferring the active layer from a substrate onto a base substrate by adopting a film transfer method.

Based on the above structure of the transistor acoustic sensor element, the present disclosure further provides a method for manufacturing the transistor acoustic sensor element, as shown in FIG. 4, including:

forming a gate 2, a gate insulating layer 3, a first electrode 4, an active layer 5 and a second electrode successively on a base substrate 1, wherein the active layer 5 is formed on a substrate 7 by adopting a solution spin-coating method and then transferred from the substrate 7 onto the base substrate 1 by adopting a film transfer method, and the active layer 5 has a nanowire three-dimensional mesh structure.

The specific method for forming the active layer 5 on the substrate 7 by adopting the solution spin-coating method is described as below:

weighing a polymer semiconductor such as PBIBDF-BT and a stabilizer (such as PBA with a molecular weight 2000) in a certain ratio, dissolving them into a chloroform solvent and stirring evenly with a stirrer to obtain a blended solution of the PBIBDF-BT polymer semiconductor material and the PBA;

spin-coating the blended solution on the substrate 7 (transparent fluororesin CYTOP) with in a sleeve box at a revolving speed of 4000 rpm, and washing away the PBA with acetone to obtain a porous film of the PBIBDF-BT, wherein the internal structure of the film is a nanowire three-dimensional mesh structure.

In addition, as shown in FIG. 4, the specific method for transferring the active layer 5 from the substrate 7 onto the base substrate 1 by adopting the film transfer method is described as below:

dropping water droplets onto the substrate 7 on which the porous film is formed and then placing it in a low-temperature freezing chamber, peeling off the porous film from the substrate 7 with ice after 3 hours (the adhesion of the porous film to the ice is greater than that of the porous film to the hydrophobic CYTOP substrate), transferring the ice and the porous film onto the base substrate 1 on which the gate 2, the gate insulating layer 3 and the first electrode 4 are formed; and finally sublimating the ice using a vacuum dryer to obtain a PBIBDF-BT polymer semiconductor film (i.e., the active layer 5).

The materials and methods for forming the gate 2, the first electrode 4 and the second electrode on the base substrate 1 are the same. Specifically, a graphene film is firstly formed on a copper foil. For example, the copper foil is placed into a chemical vapor deposition (CVD) furnace, methane and hydrogen in a certain proportion are introduced into the furnace at 1000° C., and the graphene film is formed on the copper foil. Then, the graphene film is transferred onto the base substrate 1, and this step specifically includes: forming a polymer support layer on the side of the graphene film opposite to the copper foil and solidifying the same; for example placing the copper foil with the graphene film into a spin-coating device, spin-coating one side of the graphene film opposite to the copper foil with a polymer support layer (e.g., polymethyl methacrylate (PMMA)), and then placing the copper foil with the graphene film and the polymer into a baking device to solidify the polymer. Next, the copper foil is removed to form a graphene film supported by the polymer support layer. For example, the copper foil is placed into diluted acetic acid and etched away by the acid, and then the graphene film supported by the PMMA is left. Finally, the graphene film supported by the polymer support layer is transferred onto the base substrate, wherein the polymer is on the side of the graphene film opposite to the base substrate 1. When the gate 2 and the first electrode 4 are formed, after transferring the graphene film onto the base substrate 1, the method further includes: removing the polymer support layer to form the gate 2 and the first electrode 4 on the base substrate 1. For example, the polymer support layer may be removed with acetone solvent and the graphene film is left. When the second electrode is formed, after transferring the graphene film onto the base substrate 1, the polymer support layer 8 does not need to be removed and it is left as a protective layer (as shown in FIG. 1) to protect each film formed on the base substrate 1.

In addition, the gate insulating layer 3 is formed by conventional atomic layer deposition (ALD), which will not be described redundantly.

The transistor acoustic sensor element provided by the present disclosure adopts an active layer having a nanowire three-dimensional mesh structure which can vibrate under the action of sound signals, so that the current transmitted to the second electrode from the first electrode by pass through the active layer in the transistor acoustic sensor element changes correspondingly on the basis of the original current, thereby detecting the sound signals. Compared with the conventional acoustic sensor devices, since the active layer having the nanowire three-dimensional structure can sensitively sense weak vibration of acoustic waves, the sensitivity to the sound signals of the transistor acoustic sensor element can be remarkably improved and thereby improving its sensing performances on sound.

The present disclosure further provides an acoustic sensor including a plurality of aforementioned transistor acoustic sensor elements arranged in an array.

The acoustic sensor formed by the plurality of transistor acoustic sensor elements arranged in an array has a wider range for sound sensing and a higher sensitivity to sound sensing.

Preferably, the acoustic sensor further includes a signal acquisition and analysis unit which is connected to each transistor acoustic sensor element and used for acquiring and comprehensively analyzing output signals of each transistor acoustic sensor elements to obtain information of the sound signals such as incoming direction distribution and intensity distribution. The incoming direction distribution information of the sound signals refers to the relationships of the incoming direction and the intensity of the sound signals, such as the sound signals form A direction are dense and the sound signals form B direction are sparse. The intensity distribution information of the sound signals indicates the relationships of the regions of the acoustic sensor and the intensity of the sound signals, such as the intensity of the sound signals received by A region of the transistor acoustic sensors is high, and the intensity of the sound signals received by B region of the transistor acoustic sensors is low. By acquiring the incoming direction distribution information and the intensity distribution information of the sound signals, the sound signals can be sensed in a wider range and more angles, so that the acoustic sensor has more powerful functions.

The present disclosure further provides a portable device including the aforementioned acoustic sensor.

By adopting the acoustic sensor described in the present disclosure, the sensitivity to sound signals of the portable device is improved and the sound sensing range thereof is expanded.

The portable device provided by the present disclosure is any smart electronic equipment that can be carried around.

In a specific embodiment, a transistor acoustic sensor element of the present disclosure was manufactured.

A polydimethylsiloxane base substrate was used (a PDMS main agent and a hardener were mixed uniformly in a mass ratio of 10:1, the mixed solution was vacuumized to make air bubbles therein float to the surface and break, and then the mixed solution was placed into an oven of 120° C. and baked for about 1 h to obtain the PDMS base substrate, wherein the main agent and the hardener were purchased from Sigma-Aldrich), and a gate 2, a first electrode 4 and a second electrode 6 were then formed on the base substrate 1 successively by the following method.

First, a graphene film was formed on a copper foil. The copper foil was placed into a CVD furnace, methane and hydrogen in a certain proportion were introduced into the furnace at 1000° C., and the graphene film was formed on the copper foil. Then, the copper foil with the graphene film was placed into a spin-coating device, a polymethyl methacrylate (PMMA) support layer was coated on the side of the graphene film opposite to the copper foil and the obtained copper foil was placed into a baking device after spin-coating to solidify the PMMA. Next, the obtained copper foil was placed into diluted acetic acid solution, so that the copper foil was etched away by the acetic acid and the graphene film supported by the PMMA was left. Finally, the graphene film supported by the polymer support layer was transferred onto the base substrate, wherein the PMMA was located on the side of the graphene film opposite to the base substrate 1.

When the gate 2 and the first electrode 4 were formed, the polymer support layer was removed with an acetone solvent after the graphene film was transferred onto the base substrate 1 to left the gate 2 and the first electrode 4 on the base substrate 1. When the second electrode 6 was formed, the polymer support layer 8 was retained as a protective layer after the graphene film was transferred onto the base substrate 1 to protect each film formed on the base substrate 1.

An active layer 5 was formed on a substrate 7 (a CYTOP/GLASS substrate, the CYTOP substrate was purchased from Asahi Glass Co., Ltd., and the GLASS was purchased from Corning Corporation) using a solution spin-coating method, and then the active layer 5 was transferred from the substrate 7 onto the base substrate 1 by a film layer transfer method.

Specifically, a PBIBDF-BT polymer semiconductor and a PBA (a stabilizer, with a molecular weight 2000) were weighed in a mass ratio of 85:15, and then dissolved into a chloroform solvent and stirred evenly with a stirrer to obtain a blended solution of the PBIBDF-BT polymer semiconductor material and the PBA. Then, the substrate 7 modified by CYTOP (transparent fluororesin) was spin-coated with the blended solution in a sleeve box at a revolving speed of 4000 rpm with a coating thickness of 60 nm, and the PBA was washed away with acetone to obtain a porous film of the PBIBDF-BT material, wherein the internal structure of the film is a nanowire three-dimensional mesh structure.

Then, the active layer 5 was transferred from the substrate 7 onto the base substrate 1 by a film transfer method, as shown in FIG. 4. Water droplets were dropped onto the substrate 7 on which the porous film was formed, then the substrate 7 with the porous film was placed into a freezing chamber at a temperature below 0° C. After 3 hours, the porous film with ice was peeled off from the substrate 7 (the adhesion of the porous film to the ice is greater than that of the porous film to the hydrophobic CYTOP substrate), and the porous film with ice was transferred onto the base substrate 1 on which the gate 2, the gate insulating layer 3 and the first electrode 4 were formed. Finally, the ice was sublimated using a vacuum dryer to obtain a PBIBDF-BT polymer semiconductor film (i.e., the active layer 5).

The gate insulating layer 3 was formed by atomic layer deposition (ALD) method, comprising:

(1) plating the gate 2 with an Si film having a thickness of about 10 nm in a PVD chamber;

(2) loading the obtained substrate into an atomic layer deposition reaction chamber, and vacuumizing the reaction chamber to a stable gas pressure at 0.2-0.6 Torr (introducing inert gas Ar to stabilize the gas pressure);

(3) performing atomic layer deposition using trimethyl-aluminum as an aluminum source and $H_2O$ as an oxygen source with reaction periods of 140-160; and (4) performing atomic layer deposition using trimethyl-aluminum as an aluminum source and $O_3$ as an oxygen source with reaction periods of 240-260 to obtain an aluminum oxide insulating layer 3.

Compared with the prior art, the transistor acoustic sensor of the present disclosure adopts an active layer having a nanowire three-dimensional mesh structure which could sense weak vibration of sound waves with better sensitively, thereby improving the sound sensing performances of the acoustic sensor and realizing ultra-sensitive sound sensing.

It could be understood that the above embodiment is merely an exemplary embodiment for illustrating the principle of the present disclosure, but the present disclosure is not limited thereto. Various variations and improvements may be made for those of ordinary skill in the art without departing from the spirit and essence of the present disclosure, and these variations and improvements fall into the protection scope of the present disclosure.

The invention claimed is:

1. A transistor acoustic sensor element, comprising a gate, a gate insulating layer, a first electrode, an active layer and a second electrode arranged on a base substrate, wherein the active layer has a nanowire three-dimensional mesh structure which can vibrate under the action of sound signals so that the output current of the transistor acoustic sensor element changes correspondingly, wherein the active layer is arranged between the first electrode and the second electrode, and the transistor acoustic sensor element is a vertical structure transistor.

2. The transistor acoustic sensor element according to claim 1, wherein the active layer is made of a polymer organic semiconductor material.

3. The transistor acoustic sensor element according to claim 2, wherein the material of the active layer is selected from P3HT, PDQT, PDVT-10, PPhTQ, P(DPP4T-co-BDT), P3OT, BAS-PPE, TA-PPE, PQT-12 or PBIBDF-BT.

4. The transistor acoustic sensor element according to claim 1, wherein the active layer substantially has a thickness of about 50-500 nm.

5. The transistor acoustic sensor element according to claim 1, wherein the active layer comprises a single sub-film or a plurality of sub-films.

6. The transistor acoustic sensor element according to claim 1, wherein the gate insulating layer is made of alumina.

7. The transistor acoustic sensor element according to claim 1, wherein the gate, the first electrode and the second electrode are all made of graphene.

8. The transistor acoustic sensor element according to claim 1, wherein the base substrate is made of polydimethylsiloxane.

9. An acoustic sensor, comprising a plurality of transistor acoustic sensor elements of claim 1 which are arranged in an array.

10. An acoustic sensor, comprising a plurality of transistor acoustic sensor elements of claim 2 which are arranged in an array.

11. An acoustic sensor, comprising a plurality of transistor acoustic sensor elements of claim 3 which are arranged in an array.

12. An acoustic sensor, comprising a plurality of transistor acoustic sensor elements of claim 4 which are arranged in an array.

13. An acoustic sensor, comprising a plurality of transistor acoustic sensor elements of claim 5 which are arranged in an array.

14. An acoustic sensor, comprising a plurality of transistor acoustic sensor elements of claim 6 which are arranged in an array.

15. An acoustic sensor, comprising a plurality of transistor acoustic sensor elements of claim 7 which are arranged in an array.

16. A portable device, comprising the acoustic sensor of claim 9.

17. A method for manufacturing a transistor acoustic sensor element, comprising forming a gate, a gate insulating layer, a first electrode, an active layer and a second electrode successively on a base substrate, wherein the active layer is formed on a substrate by adopting a solution spin-coating method and then transferred from the substrate onto the base substrate by adopting a film transfer method, and the active layer has a nanowire three-dimensional mesh structure, wherein the active layer is arranged between the first electrode and the second electrode, and the transistor acoustic sensor element is a vertical structure transistor.

18. The method for manufacturing the transistor acoustic sensor element according to claim 17, wherein the methods for forming the gate, the first electrode and the second electrode are the same, and comprise:

forming a graphene film on a copper foil; and
transferring the graphene film onto the base substrate.

19. The method for manufacturing the transistor acoustic sensor element according to claim 18, wherein transferring the graphene film onto the base substrate comprises:

forming a polymer support layer on the side of the graphene film opposite to the copper foil and solidifying the polymer support layer;

removing the copper foil to leave the graphene film supported by the polymer support layer;

transferring the graphene film supported by the polymer support layer onto the base substrate;

when the gate and the first electrode are formed, after transferring the graphene film onto the base substrate, the method further comprises:

removing the polymer support layer to leave the gate and the first electrode on the substrate;

when the second electrode is formed, after transferring the graphene film onto the base substrate, the polymer support layer does not need to be removed.

* * * * *